(12) United States Patent
Taddiken

(10) Patent No.: US 6,964,378 B2
(45) Date of Patent: Nov. 15, 2005

(54) CIRCUIT FOR A FOCUSED ION BEAM (FIB) SENSOR

(75) Inventor: Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/657,602

(22) Filed: Sep. 8, 2003

(65) Prior Publication Data

US 2004/0051054 A1 Mar. 18, 2004

Related U.S. Application Data

(63) Continuation of application No. PCT/DE02/00548, filed on Feb. 15, 2002.

(30) Foreign Application Priority Data

Mar. 7, 2001 (DE) .......................................... 101 11 027

(51) Int. Cl.⁷ .............................................. G06K 19/06
(52) U.S. Cl. ..................... 235/492; 235/451; 250/492.1
(58) Field of Search ................................ 235/492, 487, 235/451; 324/750; 250/309, 492.1

(56) References Cited

U.S. PATENT DOCUMENTS

| | | | |
|---|---|---|---|
| 4,814,849 A | | 3/1989 | Schrenk |
| 5,434,422 A | * | 7/1995 | Iwamoto et al. ......... 250/491.1 |
| 5,656,811 A | * | 8/1997 | Itoh et al. .................... 250/309 |
| 5,844,416 A | * | 12/1998 | Campbell et al. ........... 324/750 |
| 6,404,274 B1 | * | 6/2002 | Hosono et al. ............. 327/538 |
| 6,452,283 B2 | | 9/2002 | Smola et al. |
| 6,686,623 B2 | * | 2/2004 | Yamazaki .................... 257/315 |

FOREIGN PATENT DOCUMENTS

| | | |
|---|---|---|
| EP | 0 510 434 A2 | 10/1992 |
| WO | 00/11719 | 3/2000 |

* cited by examiner

Primary Examiner—Steven S. Paik
(74) Attorney, Agent, or Firm—Laurence A. Greenberg; Werner H. Stemer; Ralph E. Locher

(57) ABSTRACT

A circuit is enabled to capacitively drive a memory cell (erasing, programming, and reading) via a capacitance. The capacitance is additionally present and isolates the antenna from the driver circuit of the memory cell. Charge accumulates on the antenna in the case of a FIB attack. The capacitance prevents the charge from flowing away, so that the voltage thus generated acts on the memory cell, which thus experiences a corresponding alteration of its charge state, which is detected. The capacitance can be implemented and realized in any conventional manner, such as any arbitrary capacitor structure of the circuit.

4 Claims, 1 Drawing Sheet

CIRCUIT FOR A FOCUSED ION BEAM (FIB) SENSOR

CROSS-REFERENCE TO RELATED APPLICATION

This application is a continuation of copending International Application No. PCT/DE02/00548, filed Feb. 15, 2002, which designated the United States and which was not published in English.

BACKGROUND OF THE INVENTION

Field of the Invention

The present invention relates to a circuit for a focused ion beam (FIB) sensor which can be used, in particular, for the protection of chip card and smart card ICs.

Electronic circuits, and primarily circuits provided with a memory for holding personal information, must must be protected against unauthorized analysis, in particular against covert discovery of the stored data. One possible attack can be effected by FIB (Focused Ion Beam). Such an attack can be detected by a circuit suitable for this, so that suitable countermeasures can be initiated in the case of an attack that has been ascertained. By way of example, it can be ensured that during or after such an attack, the electronic circuit is rendered unusable to the extent that information can no longer be read out in an unauthorized manner.

A protection circuit suitable for this constitutes a so-called "FIB sensor" which detects electrical charging—effected by the attack—of the protection circuit or of a circuit section provided for this. The charge detected by the FIB sensor as a result of the FIB attack leads to a detectable alteration of the charge content, in order to make it recognizable that the circuit was the target of an FIB attack. The FIB sensor therefore comprises a memory cell with a driver circuit and an antenna—connected to the memory cell—as electrical conductor, on which electrical charges are accumulated during an FIB attack.

The charge is fed to the memory cell in such a way that the memory cell experiences a detectable alteration of its charge content. A further circuit section is provided as driver circuit for ascertaining the state of the memory cell of the FIB sensor. It must thereby be ensured that this circuit section is connected or can be connected in such a way that the charge collected by the antenna in the case of a FIB attack does not flow away through the driver circuit before the reprogramming of the memory cell takes place.

European published patent application EP 0 510 434 A2 describes a circuit configuration for preventing an analysis of a circuit, in which a PIN photodiode is provided for the detection of impinging radiation and is connected between the inverting and the non-inverting inputs of an operational amplifier. The output of the opamp controls a switch which disconnects a volatile RAM memory to be protected from the voltage supply in the event of irradiation.

SUMMARY OF THE INVENTION

It is accordingly an object of the invention to provide a circuit for a FIB sensor which overcomes the above-mentioned disadvantages of the heretofore-known devices and methods of this general type and which provides for a circuit that is suitable for a FIB sensor and can be implemented and realized with standard components of a smart card IC.

With the foregoing and other objects in view there is provided, in accordance with the invention, a circuit for detecting a focused ion beam attack. The circuit comprises the following elements:

a memory cell;

an antenna for detecting an FIB attack connected to the memory cell;

a driver circuit; and a capacitance connected between the memory cell and the driver circuit, for isolating the driver circuit from the antenna.

In accordance with an added feature of the invention, the memory cell is a floating gate cell, an EEPROM cell, a flash cell, or a SONOS cell.

In accordance with an additional feature of the invention, the memory cell comprises an electrically conductive electrode over a silicon area.

In accordance with another feature of the invention, there are provided two memory cells connected to the antenna and isolated from the driver circuit by the capacitance.

In accordance with a concomitant feature of the invention, the novel circuit is implemented as a FIB sensor of a smart card IC.

In other words, the circuit of the invention for detecting an FIB attack exclusively using standard components enables the driving of the memory cell (erasing, programming and reading) capacitively via a capacitance which is additionally present and which isolates the antenna from the driver circuit of the memory cell. In the case of the detection of an attack via the antenna, the capacitance prevents the charge from flowing away, so that the voltage generated acts on the memory cell, which thus experiences a detectable alteration of its charge state, for example is correspondingly reprogrammed. The capacitance can be realized in a manner known per se as an, in principle, arbitrary capacitor structure of the circuit.

The configuration of the memory cell is arbitrary, in principle. What is preferably involved is a floating gate cell, EEPROM cell (electrically erasable programmable read only memory) or flash cell, known per se. In a simple case, the memory cell can be formed by an electrically conductive electrode over a silicon area, the electrode being isolated from the silicon by an insulator which serves as storage medium. The electrode is conductively connected to the antenna. The insulator may comprise, in particular, a nitride layer. The structure can thus be formed as a SONOS cell (silicon-oxide-nitride-oxide-[poly-]silicon).

Other features which are considered as characteristic for the invention are set forth in the appended claims.

Although the invention is illustrated and described herein as embodied in a circuit for FIB sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
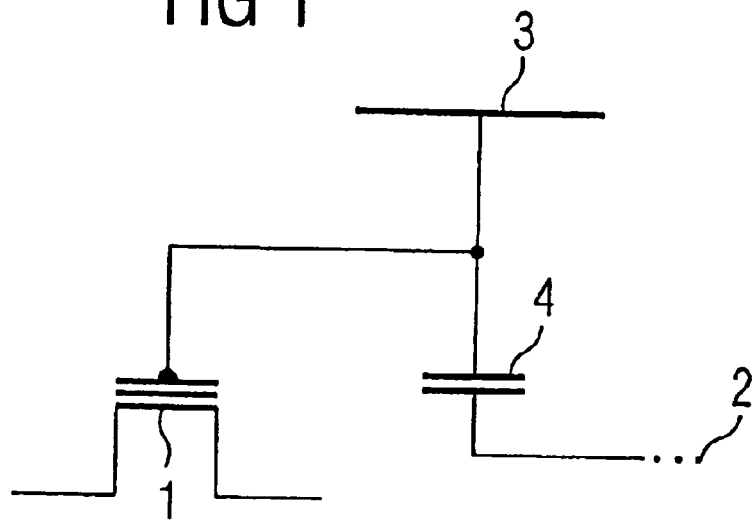
FIG. 1 is a schematic of an example of the basic circuit.

Referring now to the figures of the drawing in detail and first, particularly, to FIG. 1 thereof, there is shown the basic configuration of the circuit according to the invention. A memory cell 1 of the FIB sensor is operated by a driver circuit 2, which is known per se and, therefore, is not illustrated in detail. An FIB attack leads to charging of electrical conductors. The charge is predominantly accumulated on an antenna 3 provided for this and conducted to the memory cell. According to the invention, a capacitor 4 is provided for decoupling the driver circuit 2 from the memory cell 1 and the circuit branch of the antenna 3.

Figure 2:
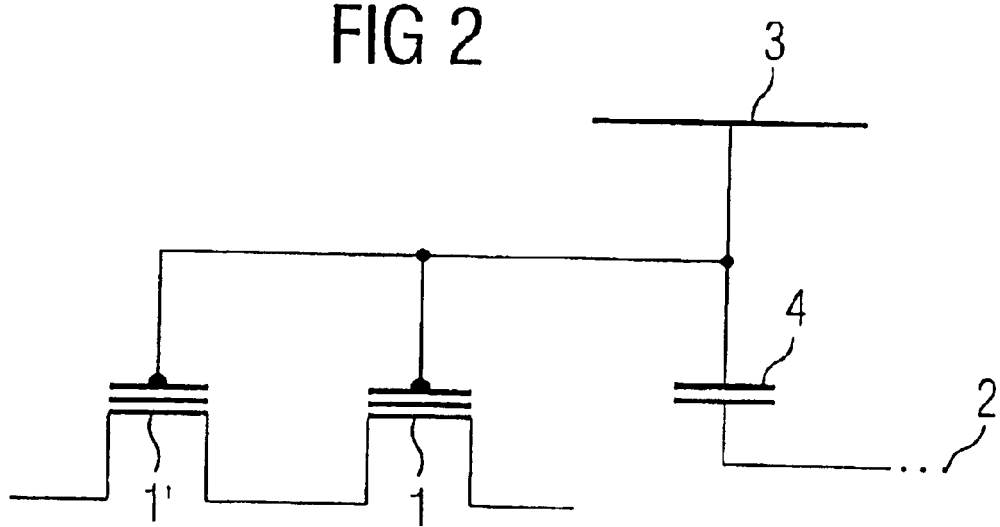
FIG. 2 is a similar schematic of a preferred exemplary embodiment according to the invention.

FIG. 2 illustrates a preferred exemplary embodiment by comparison therewith, in which there is a second memory cell 1', which is likewise connected to the antenna 3 and decoupled from the driver circuit 2 by the capacitance 4. In this case, one memory cell is designed in such a way that it detects positive charges and the other memory cell is designed in such a way that it detects negative charges. The advantage here is that charges of both signs are detected and cannot be compensated by particular measures.

The circuit according to the invention is suitable, in particular, for the operation of a FIB sensor which is provided for safeguarding a smart card IC.

I claim:

1. A circuit, connected for operation as a FIB sensor of a smart card IC, for detecting a focused ion beam attack, comprising:
   a memory cell;
   an antenna for detecting an FIB attack connected to said memory cell;
   a driver circuit; and
   a capacitance connected between said memory cell and said driver circuit, for isolating said driver circuit from said antenna.

2. The circuit according to claim 1, wherein said memory cell is a memory cell selected from the group consisting of a floating gate cell, an EEPROM cell, a flash cell, and a SONOS cell.

3. The circuit according to claim 1, wherein said memory cell comprises an electrically conductive electrode over a silicon area.

4. The circuit according to claim 1, wherein said memory cell is one of two memory cells connected to said antenna and isolated from said driver circuit by said capacitance.

* * * * *